Oct. 1, 1963 G. L. BRANCH ETAL 3,105,869

ELECTRICAL CONNECTION OF MICROMINIATURE CIRCUIT WAFERS

Filed March 23, 1962 2 Sheets-Sheet 1

INVENTORS.
GERALD L. BRANCH,
JOHN E. RICHARDSON,
ROBERT Y. SCAPPLE,
BY
Noel B. Hammond
AGENT.

Oct. 1, 1963 G. L. BRANCH ETAL 3,105,869

ELECTRICAL CONNECTION OF MICROMINIATURE CIRCUIT WAFERS

Filed March 23, 1962 2 Sheets-Sheet 2

INVENTORS
GERALD L. BRANCH,
JOHN E. RICHARDSON,
ROBERT Y. SCAPPLE,
BY
Noel B. Hammond
AGENT.

3,105,869

ELECTRICAL CONNECTION OF MICROMINIATURE CIRCUIT WAFERS

Gerald L. Branch, John E. Richardson, and Robert Y. Scapple, Los Angeles, Calif., assignors to Hughes Aircraft Company, Culver City, Calif., a corporation of Delaware Filed Mar. 23, 1962, Ser. No. 181,908
6 Claims. (Cl. 174—68.5)

The present invention relates to the electrical connection of circuit assemblies and, more particularly, to the connection to and interconnection of microminiature circuit wafers.

The physical size of electronic components and circuit assemblies has steadily diminished as technology has advanced. Initially, components and circuit assemblies were reduced to miniature size, then subminiature and, at present, the physical size is even further reduced. Electronic circuits of extremely small dimensions are referred to as microminiature circuits, microcircuitry, molecular electronics, molectronics, bionics, and microelectronics. Extremely small or microscopic components may be formed or mounted on an insulating wafer and interconnected by an interconnection grid of conductive material formed on the wafer by printing, plating or vacuum deposition of a thin film. Because of the extremely small size of the circuit wafers and the even smaller size of the electrical interconnections used on such wafers, the use of conventional wiring techniques is so inefficient as to be completely impractical.

Typically, a microminiature circuit wafer may be two inches wide and three inches long, and may have electrical terminations uniformly disposed along an edge thereof at a density on the order of 50 terminations per inch, which is a spacing of .020 inch, center-to-center. It may be necessary to interconnect a large number of such wafers, 30 or more for example, to form a complete circuit assembly. Furthermore, it is desirable that the interconnections be flexible to provide access to the circuits and components on the wafers.

Accordingly, it is an object of the present invention to provide a reliable and practical interconnection arrangement for microminiature circuit wafers that is compact and yet provides access to the circuits and components on the wafers.

Another object of the invention is the provision of a method for making connections to extremely small thin film terminals in close proximity to each other on a microminiature circuit wafer.

In accordance with these and other objects of the present invention an interconnection assembly is provided that is composed of an interconnection wafer and interconnection cables extending therefrom to a plurality of microminiature circuit wafers. An external cable is also connected to the interconnection wafer. A conductive pattern, which may be a vacuum-deposited thin conductive film, on the interconnection wafer interconnects the external cable and the interconnection cables.

A feature of the invention is the mechanical arrangement of the interconnection assembly whereby the circuit wafers may be opened or closed like the pages of a book to provide a dense packaging of electronic circuits and yet which affords ready access to the circuits.

Another feature of the invention is the method of joining the cables to the wafers with a spacing on the order of 50 terminations per inch, involving the making of grooves therein, metallizing, soldering, and applying a bend restrainer.

The following specification and the accompanying drawings respectively describe and illustrate an exemplification of the present invention. Consideration of the specification and the drawings will provide an understanding of the invention, including the novel features and objects thereof. Like reference characters are used to designate like parts throughout the figures of the drawing.

Figures 1, 2:
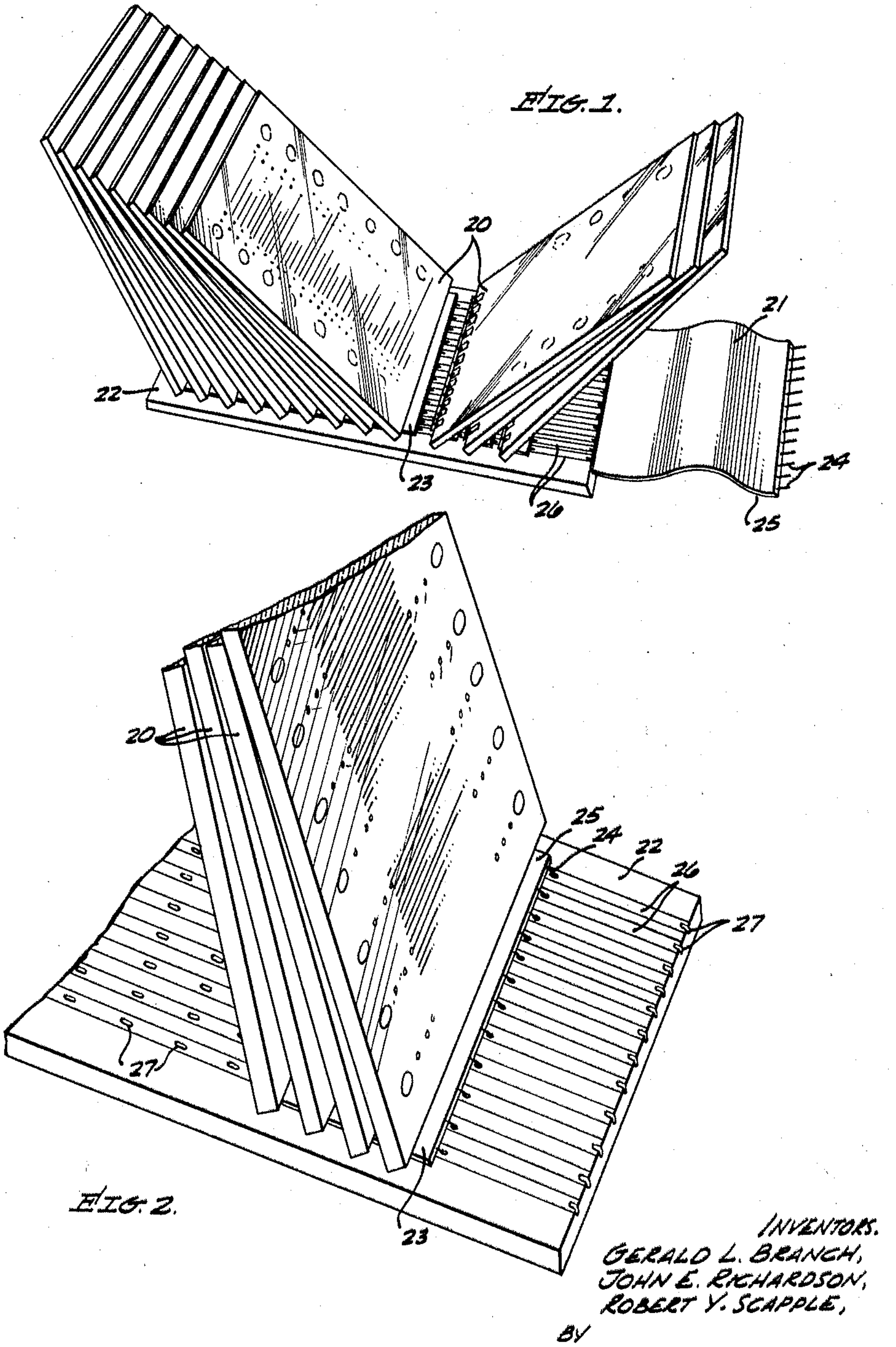
FIG. 1 is a perspective view of an embodiment of a circuit assembly in accordance with the invention, illustrating a plurality of microminiature circuit wafers connected by interconnection cables to an interconnection wafer having an external cable connected thereto.
FIG. 2 is an enlarged fragmentary perspective view of a portion of the circuit assembly of FIG. 1, illustrating the nature of the interconnection arrangement on the interconnection wafer.

Referring now to FIGS. 1 and 2, there is illustrated a circuit assembly comprising a plurality of microminiature circuit wafers 20 electrically interconnected with each other and with a flexible external cable 21 that provides input-output electrical connections for the circuit assembly. The electrical interconnections are made on an interconnection wafer 22. A plurality of short, flexible interconnection cables 23 individually connect the interconnection wafer 22 to one edge of each of the circuit wafers 20. The external cable 21 is connected to the interconnection wafer 22 at one edge thereof. As may be seen in FIGS. 1 and 2, the microminiature circuit wafers 20 are aligned with the connected edges substantially adjacent and parallel to each other, and substantially adjacent and transverse to the interconnection wafer 22. Each interconnection cable 23 is folded under the side of the associated circuit wafer 20 adjacent the connected edge thereof and extends between the side of the circuit wafer 20 and the surface of the interconnection wafer 22.

The circuit wafers 20 extend outwardly from the interconnection wafer 22 and, due to the flexible connection thereto, the outer edges of the circuit wafers 20 may be moved away from each other in a manner similar to opening the pages of a book. This provides access to the circuits and components on the circuit wafers 20 for testing, inspection or replacement purposes. Alternatively, the circuit wafers 20 may be closed together to a mutually adjacent and parallel position, to form a compact assembly having a higher density of electrical components and connections for a given volume than is normally present in electronic circuit assemblies.

The microminiature circuit wafers 20 and the interconnection wafer 22 are insulating substrates which are provided with electrical conductors of a size commensurate with that of microminiature components. The circuit wafers 20 are provided with electronic components connected to an interconnection grid which comprises a plurality of horizontal conducting lines or conductors, and a superimposed plurality of vertical conducting lines, suitably insulated from the horizontal lines. Connections are made between particular horizontal and vertical conducting lines, and the electrical continuity of certain of the lines is interrupted at particular points in accordance with the desired circuit configuration.

The microminiature circuit wafers 20 and the interconnection wafer 22 may be, for example, insulating substrates made of a photosensitive glass-ceramic by the Corning Glass Company, and having dimensions on the order of 2 x 3 x .030 inch. The interconnection grid may be, for example, thin conductive films separated by insulating films and formed on the substrate by vacuum deposition and a selective etching process utilizing photographic techniques. Interconnection grids for microminiature circuit wafers, and methods of making the same, are shown and described in U.S. patent application Serial No. 18,759, filed March 30, 1960 and U.S. patent application Serial No. 106,706, filed May 1, 1961, both assigned to the assignee of the present application.

The external cable 21 extending from the interconnection wafer 22 and the interconnection cables 23 extending between each of the circuit wafers 20 and the interconnection wafer 22 are thin, flat, flexible multiconductor cables. These cables 21 and 23 have a plurality of substantially parallel electrical conductors 24 embedded in a plastic insulating material 25. The insulating material 25 may be a fluorinated plastic, vinyl or hydrocarbon, and may be formed of laminations thermally fused about the conductors 24, either a short section at a time, or continuously in an automatic machine. In the present example, the insulating material 25 is polyvinyl chloride and the conductors 24 are .005 inch round enameled copper wires spaced with a density on the order of 50 wires per inch.

As indicated in FIG. 2, the exemplary embodiment of an interconnection wafer 22 of the present invention connects the external cable 21 to each of the circuit wafers 20 in parallel. That is, the interconnection wafer 22 is provided with a vacuum-deposited thin conductive film arranged in a pattern of parallel conductive strips 26 extending in only one direction rather than having two mutually insulated films of orthogonal strips forming a grid. This arrangement is useful where a plurality of similar circuits are connected in parallel as in a matrix, or a circuit in which redundancy is desired for reliability or other purposes. Alternatively, the conductive strips 26 on the interconnection wafer 22 may be interrupted at predetermined locations, if desired, to interconnect only predetermined ones of the circuit wafers 20. Also, the interconnection wafer 22 may be provided with an interconnection grid on the reverse side, if desired, the connections between the conductive strips 26 and the grid being made by conductors passing through the holes provided for that purpose in the interconnection wafer 22.

The conductive strips 26 are provided with grooves 27 arranged in substantially uniformly spaced parallel rows which may be considered to be parallel rows of terminals extending in a direction transverse to the direction of the conductive strips 26. As may be seen in FIG. 2, the circuit wafers 20 are aligned with the connected edges substantially adjacent and parallel to each other and to the rows of terminals or grooves 27 on the interconnection wafer 22. Each interconnection cable 23 from a circuit wafer 20 is connected to the conductive strips 26 by soldering the conductors 24 into the grooves 27 therein, to form a row of connections.

Figure 3:
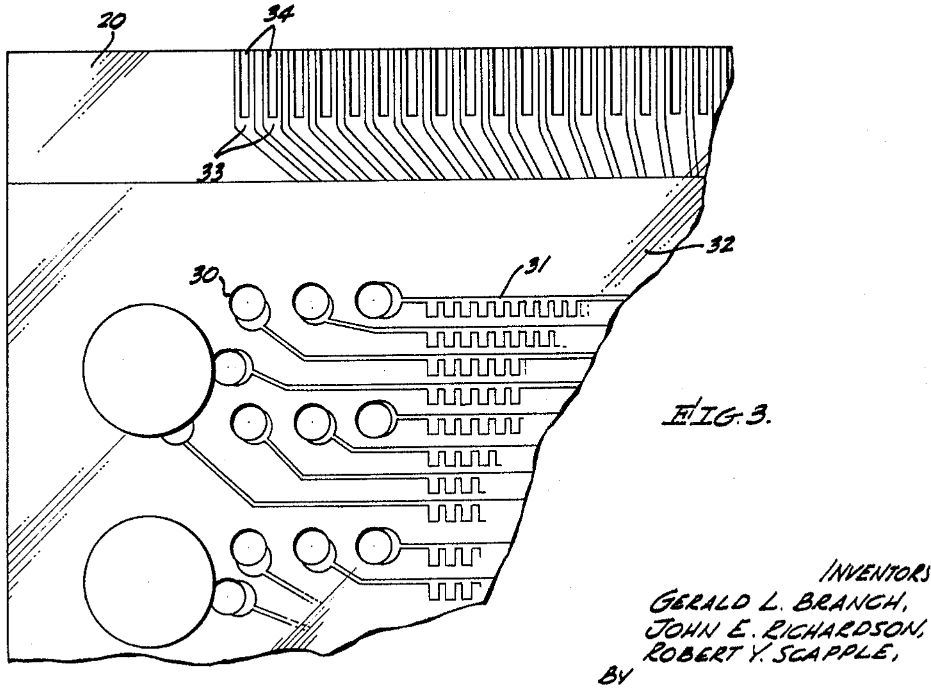
FIG. 3 is a greatly enlarged fragmentary plan view of a portion of one of the microminiature circuit wafers, illustrating grooved connection terminals thereon.

Referring now to FIG. 3, there is shown a greatly enlarged fragmentary view of the connection area of a microminiature circuit wafer 20. Microminiature electronic components are indicated generally at 30. The upper layer of a deposited film interconnection grid and associated interconnection tabs, is indicated generally at 31. Extending from beneath a thin deposited insulating film 32 is a plurality of uniformly spaced conductive pads or circuit terminals 33 disposed in a row along one edge of the microminiature circuit wafer 20. The terminals 33 are widened areas of the conductive material on the circuit wafer 20 and may be formed simultaneously with the formation of the interconnection grid and by the same processes. The terminal density may be on the order of 50 terminals per inch, resulting in a terminal spacing on the order of .020 inch, center-to-center. It will usually be found convenient to provide indentical spacing of the terminals 33, the conductive strips 26 on the interconnection wafer 22, and the conductors 24 of the cables 21 and 23.

To facilitate making satisfactory electrical and mechanical connection of the interconnection cables 23 to the circuit wafers 20, grooves 34 are provided in the terminals 33, similarly to the grooves 27 in the conductive strips 26 of the interconnection wafer 22. The grooves 27, 34 are on the order of .125 inch long, .010 inch wide and .006 inch deep, and extend through the conductive material and into the substrate material itself. The grooves 27, 34 in the circuit wafers 20 and the interconnection wafer 22 may easily be made with an ultrasonic tool, for example. It has been found convenient to form an entire row of grooves 27, 34 simultaneously by first brazing a small block of metal to an ultrasonic transducer, the block having a row of teeth dimensioned in accordance with the dimensions of the grooves 27, 34 to be produced, and then utilizing the tool to form a row of grooves 27, 34.

The grooves 27, 34 are metallized to provide a solderable and electrically conductive surface therein electrically connected to the thin film deposited terminals 33 or the conductive strips 26 on the wafers 20, 22. The wafers 20, 22 are first sensitized with a sensitizer, such as stannous and palladium chloride for example, to render them capable of being metal plated. The wafers 20, 22 are then plated with a thin layer (on the order of .000150 inch, for example) of metal such as nickel by an electroless or chemical deposition process. In this step, the entire connection area, both within the grooves 27, 34 and between the terminals 33 or the conductive strips 26, is plated. Following this, the plating is removed from the area between the terminals 33 or the conductive strips 26 by a selective etching process utilizing photographic techniques. This is accomplished by first coating the connection area with a photoresist material, that is, a material whose resistance to an etchant may be controlled by selective exposure of its surface to light. Next, light is selectively applied to the surface of the photoresist through a suitable mask, following which a photographic developer is applied to the surface of the exposed photoresist. A water rinse washes away the unexposed portions of the photoresist, leaving the exposed portions of the photoresist in place. Following removal of the nonexposed photoresist, the unwanted nickel plating between the terminals 33 or the conductive strips 26 is removed with an etchant such as a warm ferric chloride solution, for example. The exposed portions of the photoresist resist the action of etchants and consequently, the etchant will attack metal at the unexposed portions. The wafers 20 and 22 are then etched to remove all traces of the sensitizer. Dilute nitric acid is a suitable etchant when the sensitizer is stannous and palladium chloride. Then, the photoresist is removed with an organic solvent such as an epoxy solvent. The connection area is then plated with a metal such as gold by an immersion process to a thickness of 0.0006 inch, for example. The gold deposits only on the portions where the nickel plating remains and is used to increase the storage life of the metallized surface and to make it more adaptable to being soldered. The grooves 27, 34 in the wafers 20, 22 are tinned with a soft solder alloy having a high ultimate tensile strength, good ductility, high electrical conductivity, a low melting temperature, and good wetting characteristics. A solder alloy of 25% indium, 37½% lead and 37½% tin has been found to be satisfactory. Preformed solder pellets may be used for this operation. An activated rosin flux is first brushed into the grooves 27, 34, following which, solder pellets ⅛ inch long and .006 inch in diameter are placed in the grooves 27, 34. The wafers 20, 22 are then uniformly heated until the solder liquefies. It has also been found satisfactory to tin the grooves 27, 34 by dipping the wafers 20, 22 in molten solder after the grooves 27, 34 have been treated with the activated rosin flux. The dip tinning operation leaves the grooves 27, 34 approximately 75% filled with solder, which is sufficient for subsequent soldering of the cable conductors 24. Following the tinning operation, the flux residue is removed with suitable solvents such as xylene and isopropyl alcohol.

The cables 21, 23 are prepared for soldering by removing the plastic insulation 24 at the ends thereof to bare approximately 1/16 inch of the wire conductors 24. This stripping may be accomplished by thermal or mechanical means. The enamel insulation on the conductors 24 is removed with a suitable solvent. The conductors 24 are then cleaned with alcohol, dipped in the activated rosin flux and tinned by dipping the exposed ends of the conductors 24 into molten solder for approximately two seconds.

The conductors 24 are soldered into the grooves 27, 34 utilizing a soldering tool which provides concentration of heat, a minimum of time to melt the solder, which is small enough to fit in the grooves 27, 34 and which can be used to position the conductors 24 in the grooves 27, 34. The tool comprises a length of fine Nichrome wire formed into a small rectangular loop and fastened in a holder. Nichrome wire is used because of its high electrical resistance, thermal stability, and resistance to solder wetting. The soldering tool is connected to a resistance soldering power supply and timer which supplies a predetermined current to the Nichrome wire for a predetermined time interval. The tinned wire conductors 24 are placed in the tinned grooves 27, 34 of the wafers 20, 22 and an activated rosin flux is applied with a small brush. The Nichrome soldering tool is placed on the wire conductor 24 with the distal end of the rectangular loop transverse to the conductor 24, and current is applied for one or two seconds, which melts the solder. The Nichrome tool is maintained on the conductor 24 after the current is turned off until solidification of the solder occurs, to hold the conductor 24 positioned in the grooves 27, 34. To facilitate the soldering operation, the process is observed through a microscope, a binocular wide field microscope having a magnification of 20 times being found satisfactory. It has been found that it is virtually impossible to make satisfactory solder joints when working with such small elements without the aid of a microscope, but with its aid, it is relatively simple, fast, and nonfatiguing. After soldering, the flux residue is removed with a solvent.

It has been found convenient to form the Nichrome wire of the soldering tool into a plurality of rectangular loops in the same plane for soldering some or all of the connections in a row simultaneously.

Figure 4:
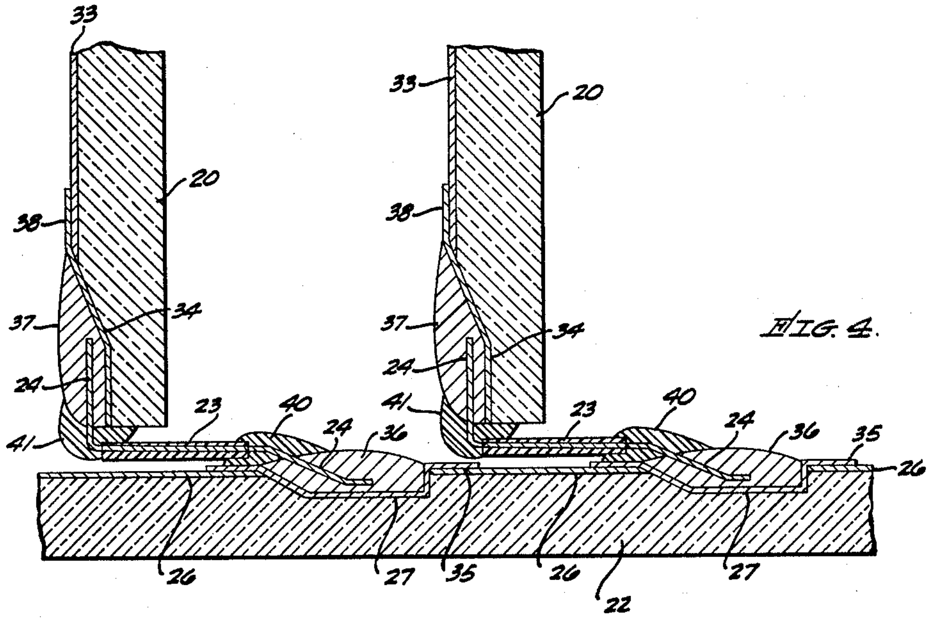
FIG. 4 is a greatly enlarged fragmentary elevational view in cross-section, of two microminiature circuit wafers connected to the interconnection wafer.

FIG. 4 illustrates a greatly enlarged cross-sectional view of two circuit wafers 20 connected to an interconnection wafer 22. As may be seen therein, the nickel and gold plating 35 covers the bottom of the grooves 27 in the interconnection wafer 22 and extends to the deposited film conductive strip 26. The ends of the conductors 24 of the interconnection cable 23 are mechanically and electrically connected in the grooves 27 by solder masses 36. Similarly, the other ends of the conductors 24 are mechanically and electrically connected to solder masses 37 in the grooves 34 in the circuit wafers 20, the nickel and gold plating 38 extending from the bottom of the grooves 34 to the deposited film terminals 33.

Bend restrainers 40 and 41 are provided at the ends of the interconnection cables 23 to prevent undue stress occurring at the solder connections or in the heat affected zone of the conductors 24. The bend restrainers 40, 41 are, in the present example, masses of resilient nonconductive material such as an epoxy resin or silicone rubber applied along the rows of grooves 27, 34 in the wafers 20, 22 at the junctions between the interconnection cables 23 and the wafers 20, 22. The bend restrainers 40 and 41 adhere to and envelop the ends of the cables 23 and solder masses 36, 37 to form a firm but resilient bond therebetween. Thus, the circuit wafers 20 are flexibly but firmly connected to the interconnection wafer 22 by the interconnection cables 23.

It may be found desirable to mechanically fasten the wafers 20, 22 together by means of a rigid frame firmly attached to the interconnection wafer 22, to which the circuit wafers 20 are pivotally secured. With such an arrangement, it may be found that the bend restrainers 40 and 41 may be dispensed with. Furthermore, it may be found that suitable electrical connections may be made without the utilization of grooves 27 and 34 in the wafers 20, 22 by merely applying the nickel and gold plating 35, 38 to the deposited film and soldering the cable conductors 24 directly thereto.

Tests were performed on interconnections made in accordance with the present invention to determine the mechanical strength thereof. It was found that in tests of tensile strength of the junction, all failures occurred in the wire conductor 24 adjacent the soldered connection and that no failures developed in the solder joint itself. The junction was tested by pulling the conductor at a right angle to the wafer and peeling it away therefrom. Peeling occurred at the wire-solder interface, not at the coating-wafer interface. Flexure tests of interconnections reinforced with the bend restrainer revealed that the flexing occurred only in the cable and not at the joint. No failures were encountered in the joint itself. This indicates a high degree of reliability because flexure occurs only during construction or maintenance of the circuit assembly and the stress level at these times is lower than that developed during testing.

Thus, there has been described a reliable and practical arrangement for the interconnection of micro-miniature circuit wafers that is compact and yet provides access to the circuits and components on the wafers, including a method for making connections to extremely small thin film terminals in close proximity to each other.

While only one embodiment of the invention has been shown and described, other modifications may be made and it is intended that the foregoing disclosure shall be considered only as illustrative of the principles of the invention and not construed in a limiting sense.

What is claimed is:

1. A circuit assembly comprising: a plurality of circuit wafers formed of sheets of insulating material having conductive electrical circuit patterns thereon terminating in a plurality of substantially uniformly spaced conductive electrical terminals; an interconnection wafer formed of a sheet of insulating material having a conductive interconnection pattern thereon, each of said circuit wafers being disposed with a predetermined one of the edges thereof substantially adjacent and transverse to said interconnection wafer; a plurality of interconnection cables, each being individually connected at one end to said terminals of one of said circuit wafers, folded between the edge thereof and said interconnection wafer, and connected at the other end to said interconnection pattern of said interconnection wafer; and an external cable connected at one end to said interconnection pattern of said interconnection wafer, said cables being flat flexible multiconductor ribbon cables having substantially uniformly laterally-spaced conductors embedded in an insulating material.

2. A circuit assembly comprising: a plurality of circuit wafers each formed of a sheet of insulating material having conductive material thereon defining an electrical circuit and defining a plurality of electrical terminals arranged in a row along a portion of the perimeter thereof; an interconnection wafer formed of a sheet of insulating material having conductive material thereon defining an interconnection circuit including a plurality of terminals arranged in a plurality of substantially uniformly spaced rows, said circuit wafers being disposed with said portions of the perimeter substantially adjacent to said interconnection wafer and aligned with said rows of terminals substantially parallel to each other and to said rows of terminals on said interconnection wafer; a plurality of flat flexible multiconductor ribbon interconnection cables, each being individually connected at one end to said terminals of one of said circuit wafers, folded under a thin side adjacent said portion of the perimeter of the associated circuit wafer and extending between said thin side and said interconnection wafer, and connected at the other end to one of said rows of terminals on said interconnection wafer; and a flat flexible multiconductor ribbon external cable connected at one end to one of said rows of terminals on said interconnection wafer.

3. A circuit assembly comprising: a plurality of circuit wafers each formed of a sheet of insulating material having conductive material thereon defining an electrical circuit and defining a plurality of electrical terminals arranged in a row along a portion of the perimeter thereof; an interconnection wafer formed of a sheet of insulating material having conductive material thereon defining an interconnection circuit including a plurality of terminals arranged in a plurality of substantially uniformly spaced rows, said circuit wafers being disposed with said portions of the perimeter substantially adjacent to said interconnection wafer and aligned with said rows of terminals substantially parallel to each other and to said rows of terminals on said interconnection wafer; a plurality of flat flexible multiconductor ribbon interconnection cables, each being individually connected at one end to said terminals of one of said circuit wafers, folded under a thin side adjacent said portion of the perimeter of the associated circuit wafer and extending between said thin side and said interconnection wafer, and connected at the other end to one of said rows of terminals on said interconnection wafer; a flat flexible multiconductor ribbon external cable connected at one end to one of said rows of terminals on said interconnection wafer; and a plurality of elongated masses of resilient insulating material individually disposed on said wafers along said rows of terminals and being adhesively bonded to said wafers and the ends of said cables connected thereto.

4. A circuit assembly comprising: a plurality of circuit wafers each formed of a sheet of insulating material having conductive material thereon defining an electrical circuit and having a plurality of grooved electrical terminals arranged in a row along a portion of the perimeter thereof; an interconnection wafer formed of a sheet of insulating material having conductive material thereon defining an interconnection circuit and having a plurality of grooved terminals arranged in a plurality of substantially uniformly spaced rows, said circuit wafers being disposed with said portions of the perimeter substantially adjacent to said interconnection wafer and aligned with said rows of terminals substantially parallel to each other and to said rows of terminals on said interconnection wafer; a plurality of flat flexible ribbon interconnection cables each having a plurality of conductors individually connected at one end in said grooves of said terminals of one of said circuit wafers, said cables being folded under a thin side of said wafer adjacent said portion of the perimeter and extending between said thin side and said interconnection wafer, and said conductors connected at the other end in said grooves of one of said rows of terminals on said interconnection wafer; and a flat flexible ribbon external cable having a plurality of conductors connected at one end in said grooves of one of said rows of terminals on said interconnection wafer.

5. A circuit assembly comprising: a plurality of circuit wafers each formed of a sheet of insulating material having conductive material thereon defining an electrical circuit and defining a plurality of electrical terminals having a predetermined uniform spacing and arranged in a row along a portion of the perimeter thereof; an interconnection wafer formed of a sheet of insulating material having conductive material thereon defining an interconnection circuit including a plurality of terminals having said predetermined spacing and arranged in a plurality of substantially uniformly spaced rows, said circuit wafers being disposed with said portions of the perimeter substantially adjacent to said interconnection wafer and aligned with said rows of terminals substantially parallel to each other and to said rows of terminals on said interconnection wafer; a plurality of flat flexible ribbon interconnection cables including a plurality of conductors having said predetermined spacing, each being individually connected at one end to said terminals of one of said circuit wafers, folded under a thin side adjacent said portion of the perimeter of the associated circuit wafer and extending between said thin side and said interconnection wafer, and connected at the other end to one of said rows of terminals on said interconnection wafer; and a flat flexible ribbon external cable including a plurality of conductors having said predetermined spacing and connected at one end to one of said rows of terminals on said interconnection wafer.

6. A circuit assembly comprising: a plurality of circuit wafers formed of sheets of insulating material each having a layer of conductive material thereon in a pattern forming an electrical circuit, each circuit terminating in a plurality of uniformly spaced portions of said conductive material disposed along the perimeter of a side of the associated circuit wafer to form electrical terminals, said terminals having a predetermined spacing; an interconnection wafer formed of a sheet of insulating material having a layer of conductive material thereon in a pattern forming a plurality of uniformly spaced conductive strips having a spacing corresponding to that of said terminals; a plurality of interconnection cables; and an external cable; said cables being flat flexible multiconductor ribbon cables having uniformly laterally-spaced parallel conductors embedded in an insulating material with a spacing corresponding to that of said terminals, each of said circuit wafers being connected to said interconnection wafer by a different one of said interconnection cables, the conductors of said interconnection cables being fastened to said terminals at one end and being fastened at the other end to said conductive strips to form uniformly spaced rows of connections transverse to said conductive strips, said circuit wafers being aligned with the connected edges substantially adjacent and parallel to each other and substantially adjacent and transverse to said interconnection wafer, each of said interconnection cables being folded under the thin side adjacent the connected edge of the associated circuit wafer and extending between said thin side and said interconnection wafer, the conductors of said external cable being connected at one end to said conductive strips.

References Cited in the file of this patent

FOREIGN PATENTS

| | | |
|---|---|---|
| 720,762 | Great Britain | Dec. 29, 1954 |
| 759,446 | Great Britain | Oct. 17, 1956 |